United States Patent [19]

Watanabe

[11] Patent Number: 5,404,039
[45] Date of Patent: Apr. 4, 1995

[54] SOLID STATE IMAGING DEVICE AND METHOD OF MANUFACTURE THEREFOR

[75] Inventor: Takashi Watanabe, Soraku, Japan

[73] Assignee: Sharp Kabushiki Kaisha, Osaka, Japan

[21] Appl. No.: 72,599

[22] Filed: Jun. 3, 1993

[30] Foreign Application Priority Data

Jun. 3, 1992 [JP] Japan .................. 4-143016

[51] Int. Cl.⁶ .................. H01L 27/14; H01L 31/00
[52] U.S. Cl. .................. 257/230; 257/223; 257/229; 257/445; 257/461
[58] Field of Search .......... 257/230, 222, 223, 290, 257/257, 258, 227, 113, 445, 446, 461, 463, 229

[56] References Cited

U.S. PATENT DOCUMENTS

| 4,626,915 | 12/1986 | Takatsu | 358/213 |
| 4,814,848 | 3/1989 | Akimoto et al. | 257/223 |

FOREIGN PATENT DOCUMENTS

| 0353665A2 | 2/1990 | European Pat. Off. | |
| 60-170968A | 9/1985 | Japan . | |
| 62-24665 | 2/1987 | Japan | 257/461 |
| 62-24666 | 2/1987 | Japan . | |
| 62-131566A | 11/1987 | Japan . | |
| 2245423 | 1/1992 | United Kingdom . | |

OTHER PUBLICATIONS

S. M. Sze, *VLSI Technology*, 2nd, McGraw-Hill Book Company (1988).
M. Hamazaki et al., *Nikkei Microdevices*, "An Imaging Device", pp. 99–103, Dec., 1991.

*Primary Examiner*—William D. Larkins
*Assistant Examiner*—John F. Guay
*Attorney, Agent, or Firm*—David G. Conlin; Peter F. Corless

[57] ABSTRACT

A solid state imaging device of the present invention includes: a semiconductor substrate of one conductive type; a well layer made of a semiconductor of the other conductive type formed on the semiconductor substrate; a photodetecting portion made of a semiconductor of one conductive type formed in an upper portion of the well layer; a high concentration semiconductor layer made of the other conductive type formed in an upper portion of the photodetecting portion; a first region of one conductive type formed in an upper portion of the semiconductor substrate, being in contact with the well layer and positioned at least below the photodetecting portion, having higher concentration than the semiconductor substrate; and a second region of the other conductive type formed in a lower portion of the well layer, being in contact with the semiconductor substrate and positioned on the first region.

4 Claims, 7 Drawing Sheets

SOLID STATE IMAGING DEVICE AND METHOD OF MANUFACTURE THEREFOR

BACKGROUND OF THE INVENTION

1. Field of the Invention

The present invention relates to a solid state imaging device having a vertical overflow drain structure for preventing blooming.

2. Description of the Related Art

There is an upper limit to a charge quantity which each pixel can treat in a solid state imaging device, irrespective of its type such as CCD and MOS. For this reason, when each pixel receives excess light, charge overflows each pixel into the surrounding pixels, resulting in blooming. In order to prevent blooming, it has been proposed to provide an overflow drain structure at a photodetecting portion of the solid state imaging device so as to absorb charge which exceeds a threshold value. In recent years, a vertical overflow drain structure, which can avoid the decrease in the ratio of opening of pixels, has widely been utilized.

Figure 7:
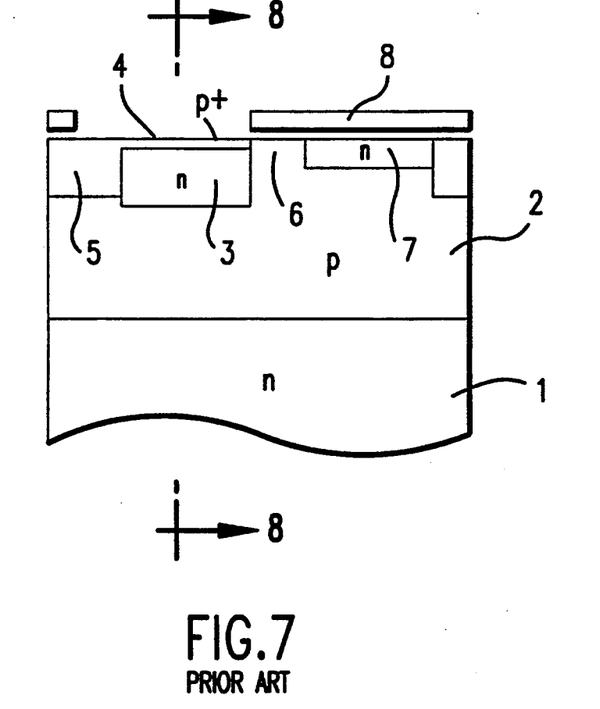
FIG. 7 is a partial longitudinal sectional view of a conventional CCD imaging device.

FIG. 7 shows a vertical overflow drain structure used in a CCD imaging device of an interline transfer type. In this figure, the structure for one pixel is schematically shown; and a vertical direction represents a depth of a device and a horizontal direction represents a direction orthogonal to a transfer direction of a vertical transfer portion. This CCD imaging device is of a conductive type using electrons as a signal charge.

Referring to FIG. 7, a p-well layer 2 is formed on an n-type semiconductor substrate 1. In part of the upper portion of the p-well layer 2, a photodetecting portion 3 made of an n-type semiconductor is formed so as to receive light for one pixel. In addition, the upper surface of the photodetecting portion 3 is covered with a high concentration p-type semiconductor layer 4. On one side of the photodetecting portion 3, a channel stop region 5 is formed. On the other side thereof, a buried channel type transfer portion 7 made of an n-type semiconductor is formed with a transfer region 6 (part of the p-well layer 2) sandwiched between the transfer portion 7 and the photodetecting portion 3. The channel stop region 5 functions as a partition between the respective pixels. The transfer region 6 regulates the conduction between the photodetecting portion 3 and the transfer portion 7 by using an electrical potential barrier. The electrical potential of the transfer portion 7 is regulated by an electrode 8 formed above the transfer portion 7, an insulating layer (not shown) being formed between the transfer portion 7 and the electrode 8.

The semiconductor substrate 1 is applied with a sufficiently high positive voltage, which is a reverse bias with respect to a channel stop electrical potential (earth electrical potential, i.e., 0 V). When excess light is incident upon the photodetecting portion 3 and a great amount of electrons are accumulated therein, electrons overflow from the photodetecting portion 3 into the reversely biased semiconductor substrate 1 beyond an electrical potential barrier formed by the p-well layer 2. Thus, blooming can be prevented.

Figure 8:
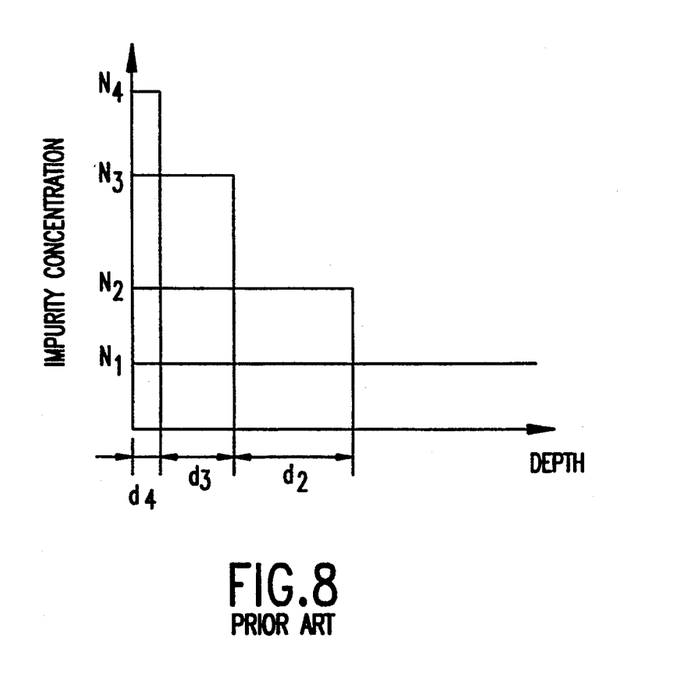
FIG. 8 is a diagram showing a distribution of impurity concentration on a 8—8 section of the CCD imaging device shown in FIG. 7.

FIG. 8 shows a distribution of impurity concentration on a B—B section of the CCD imaging device of FIG. 7. For simplicity, the impurity concentration is approximately represented in a step form. The semiconductor substrate 1 has an impurity concentration of $N_1$; the p-well layer 2 has a thickness of $d_2$ and an impurity concentration of $N_2$; the photodetecting portion 3 has a thickness of $d_3$ and an impurity concentration of $N_3$; and the semiconductor layer 4 has a thickness of $d_4$ and an impurity concentration of $N_4$.

Assuming that the maximum potential of the photodetecting portion 3 is $V_A$; a height of a potential barrier from the photodetecting portion 3 to the semiconductor substrate 1 is $V_B$; a height of a potential barrier from the semiconductor substrate 1 to the photodetecting portion 3 is $V_C$; a distance from the boundary between the semiconductor layer 4 and the photodetecting portion 3 to the depth of the photodetecting portion 3 where the maximum potential thereof is obtained; and a distance from the boundary between the p-well layer 2 and the photodetecting portion 3 to the depth of the photodetecting portion 3 where the maximum potential thereof is obtained are a and b, respectively, the following Equation (1) can be obtained.

$$V_A = \frac{qN_3}{2K_s\epsilon_o}\left(1 + \frac{N_3}{N_4}\right)b^2 \quad (1)$$

$$V_B = \frac{qN_3}{2K_2\epsilon_o}\left(1 + \frac{N_3}{N_2}\right)a^2$$

$$V_C = \frac{qN_2}{2K_s\epsilon_o}\left(1 + \frac{N_2}{N_1}\right)\left(d_2 - \frac{N_3}{N_2}a\right)^2$$

where
q: prime charge,
$K_s$: a relative dielectric constant of a semiconductor,
$\epsilon_o$: a dielectric constant of a vacuum A substrate voltage $V_{sub}$ to be applied to the semiconductor substrate 1 is represented by the following Equation (2):

$$V_{sub} = V_A - V_B + V_C \quad (2)$$

The CCD imaging device will be described with reference to FIG. 9, where the respective impurity concentrations are $N_1 = 2 \times 10^{14}$ cm$^{-3}$, $N_2 = 1 \times 10^{15}$ cm$^{-3}$, $N_3 = 2 \times 10^{16}$ cm$^{-3}$, and $N_4 = 1 \times 10^{18}$ cm$^{-3}$; the respective layer thicknesses are $d_3 = 0.672$ μm and $d_2 = 2.148$ μm; and the respective voltages at the time of depletion (electrons are not accumulated in the photodetecting portion 3) are $V_A = 6$ V, $V_B = 1$ V, and $V_C = 5$ V.

At the time of depletion, the substrate voltage $V_{sub}$ becomes 10 V according to Equation (2). As shown in FIG. 9, the height of the potential barrier $V_B$ and the height of the potential barrier $V_C$ become appropriate values, so that electrons can be accumulated in the photodetecting portion 3.

When the electrons are accumulated in the photodetecting portion 3 up to charge $Q_S$ (representing a level of a saturated signal) and the height of the potential barrier $V_B$ decreases to $V_{B0}$ under the condition that the substrate voltage $V_{sub}$ is retained, the electrons are increased to overflow into the semiconductor substrate 1 and the current is increased to an overflow current $I_{OF}$. Thus, blooming can be prevented. The height of the potential barrier $V_{B0}$ is about 0.5 V in the case of a silicon semiconductor device. Assuming that the distances a and b obtained from Equations (1) and (2) are $a_0$ and $b_0$, respectively, the charge $Q_S$ is represented by the following Equation (3):

$$Q_S = (d_3 - a_0 - b_0)N_3 \tag{3}$$

The following maximum potential $V_A$, height of the potential barrier $V_B$, substrate voltage $V_{sub}$, and charge $Q_S$ are respectively obtained based on the above.

Figure 9:
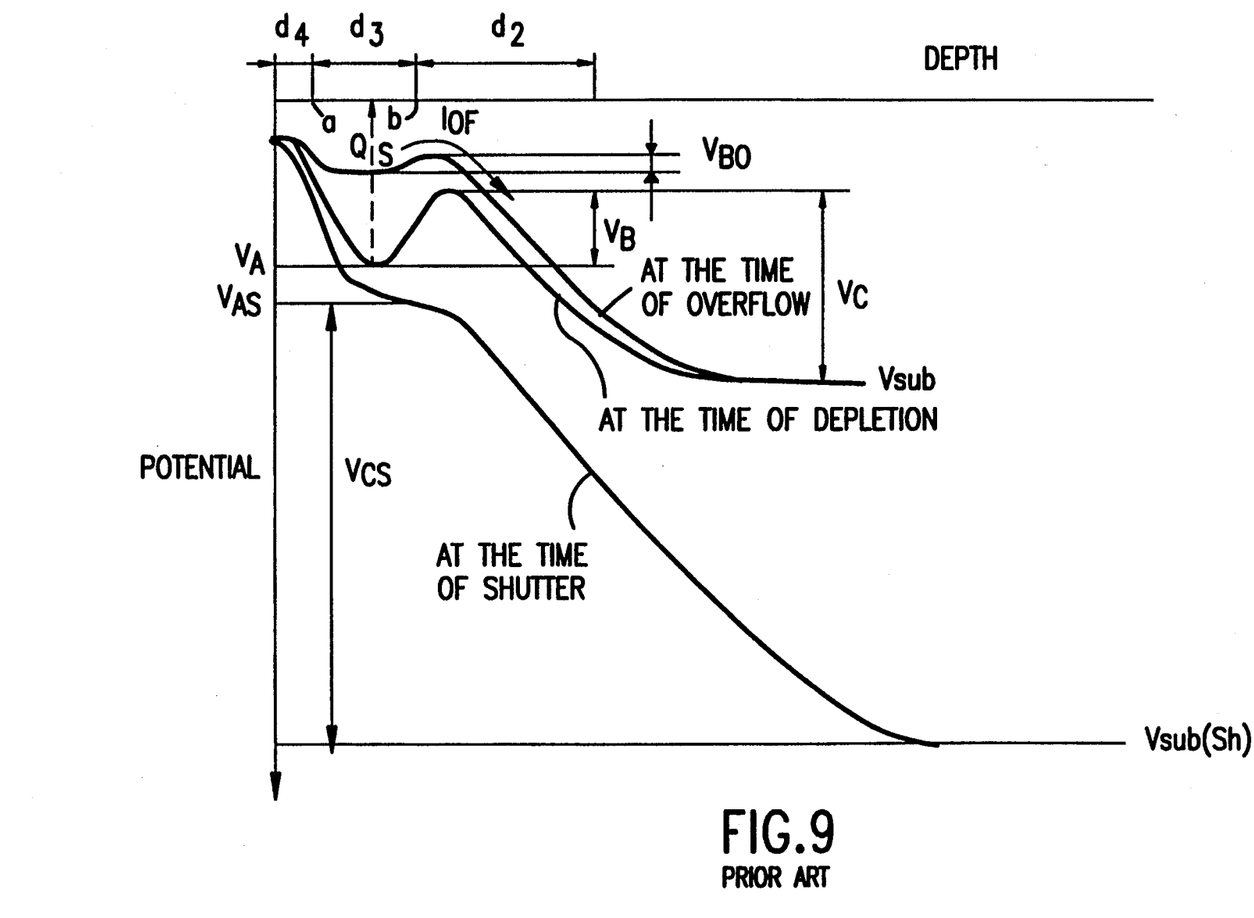
FIG. 9 is a diagram showing a potential distribution on a 8—8 section of the CCD imaging device shown in FIG. 7.

$V_A = 1.88\ V,\ V_{sub} = 10.00\ V$ $V_C = 8.62\ V,\ Q_S = 5.76 \times 10^{11}\ cm^{-2}$ This corresponds to a state of overflow shown in FIG. 9.

In addition, when the substrate voltage $V_{sub}$ is increased under the condition that electrons are not accumulated in the photodetecting portion 3, the height of the potential barrier $V_B$ is decreased. When the height of the potential barrier $V_B$ becomes 0, the potential distribution of the CCD imaging device regularly increases in the depth direction and the electrons are completely discharged into the semiconductor substrate 1 without being accumulated in the photodetecting portion 3. Thus, an electron shutter function regulating an effective accumulation time of electrons in the photodetecting portion 3 can be obtained by increasing the substrate voltage $V_{sub}$ to a higher level. In this case, the distances a and b become 0 and $d_3$, respectively. Assuming that the maximum potential $V_A$ and the height of the potential barrier $V_C$ obtained from Equation (1) are $V_{AS}$ and $V_{CS}$, respectively, the substrate voltage $V_{sub}$ can be represented by the following Equation (4):

$$V_{sub}(Sh) = V_{AS} + V_{CS} \tag{4}$$

The following maximum potential $V_A$, the height of the potential barrier $V_C$, and substrate voltage $V_{sub}$ are respectively obtained based on the above.

$V_A = 7.13\ V$,
$V_{sub} = 28.53\ V$
$V_C = 21.40\ V$

This corresponds to a state of shutter shown in FIG. 9.

As a result, in the vertical type overflow drain structure shown in FIG. 7, it is required to apply an extremely high voltage to the semiconductor substrate 1 (i.e., the substrate voltage $V_{sub}$: 10 V during ordinary operation and 28.53 V during shutter operation. Such a high voltage provides a drive circuit of a solid state imaging device with a great burden, so that it has been suggested that the substrate voltage $V_{sub}$ is decreased (Japanese Laid-Open Patent Publication No. 62-24666).

Figure 10:
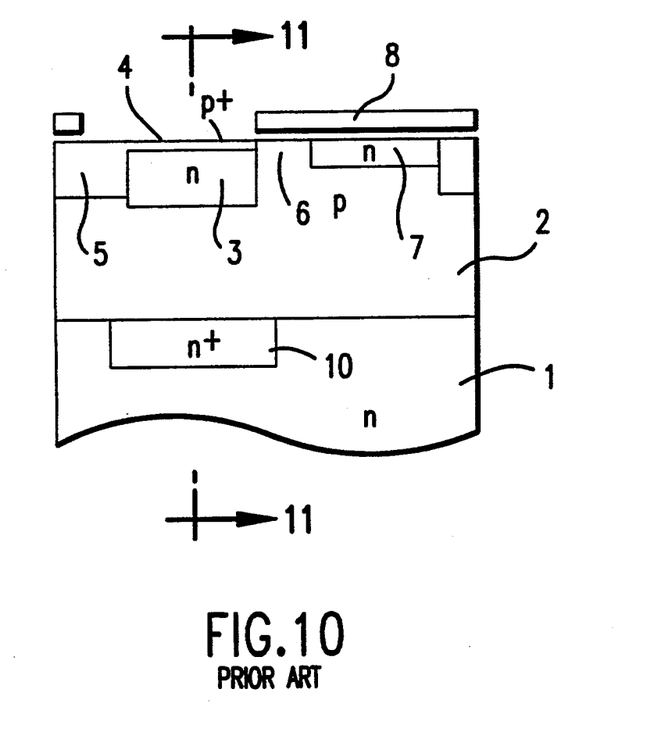
FIG. 10 is a partial longitudinal sectional view of a conventional CCD imaging device.

A vertical type overflow drain structure which is capable of decreasing the substrate voltage $V_{sub}$ is shown in FIG. 10. In this structure, a first region 10 is formed in the upper portion of the n-type semiconductor substrate 1 so as to be in contact with the p-well layer 2. In the horizontal direction, the first region 10 is formed in a region below the photodetecting portion 3. In the first region 10, the impurity concentration is higher than that of the p-well layer 2.

Figure 11:
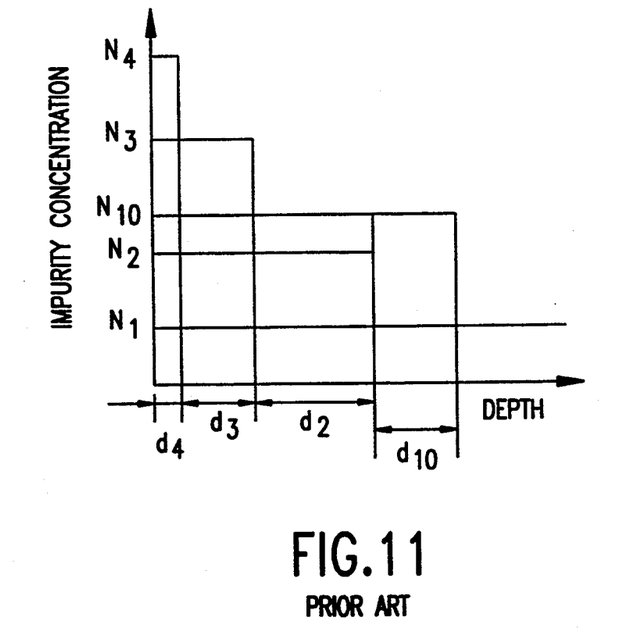
FIG. 11 is a diagram showing the distribution of impurity concentration on a 11—11 section of the CCD imaging device shown in FIG. 10.

When the first region 10 is formed in the semiconductor substrate 1, as shown in FIG. 11, the impurity concentration in a portion of the semiconductor substrate 1 in contact with the p-well layer 2 is $N_{10}$ which is higher than $N_1$. Assuming that the impurity concentration $N_{10}$ is $3 \times 10^{15}\ cm^{-3}$ under the conditions that $N_1 = 2 \times 10^{14}\ cm^{-3}$, $N_2 = 1 \times 10^{15}\ cm^{-3}$, $N_3 = 2 \times 10^{16}\ cm^{-3}$, $N_4 = 1 \times 10^{18}\ cm^{-3}$, $d_3 = 0.672\ \mu m$, $d_2 = 2.148\ \mu m$, $V_A = 6\ V$, $V_B = 1\ V$, and $V_C = 5\ V$, the maximum potential $V_A$ of the photodetecting portion 3, the height of the potential barrier $V_C$ thereof, substrate voltage $V_{sub}$, and charge $Q_S$ at the time of overflow become 1.88 V, 1.92 V, 3.29 V, and $5.76 \times 10^{11}\ cm^{-2}$. Under the same conditions as these, the maximum potential $V_A$ of the photodetecting portion 3, height of the potential barrier $V_C$ thereof, and substrate voltage $V_{sub}$ at the time of shutter become 7.13 V, 4.76 V, and 11.89 V.

Figure 12:
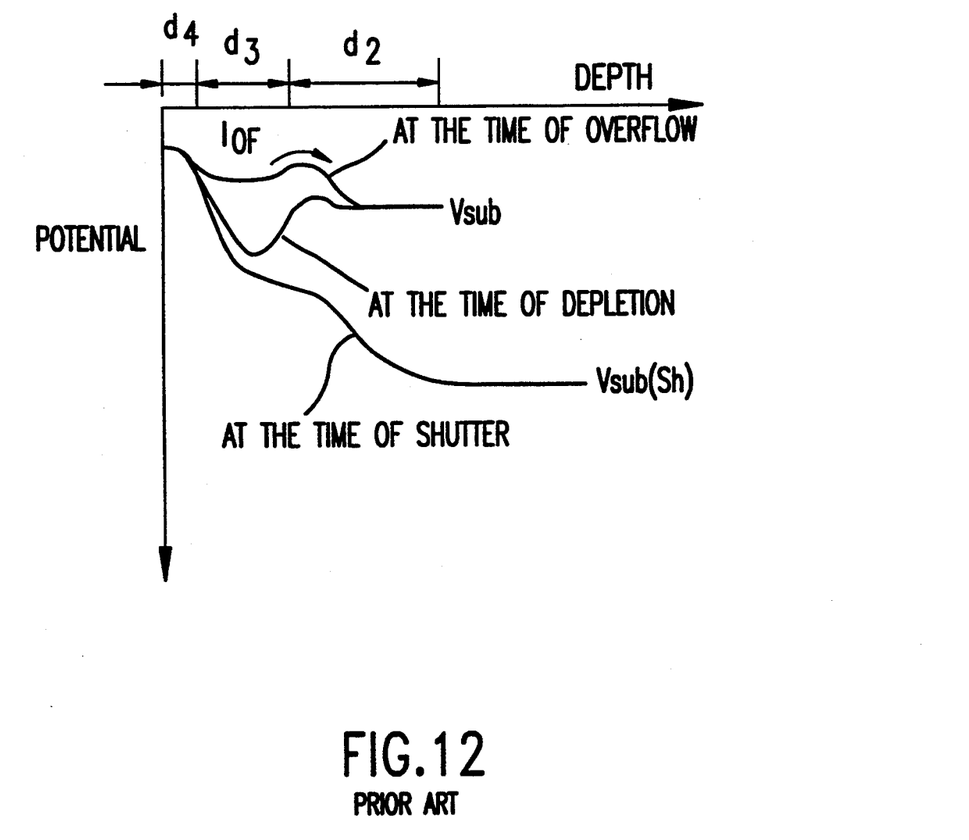
FIG. 12 is a diagram showing the potential distribution on a 11—11 section of the CCD imaging device shown in FIG. 10.

FIG. 12 shows a distribution of impurity concentration on a C—C section of the CCD imaging device of FIG. 10. In the electrical potential distribution at the time of overflow and that at the time of shutter shown in this figure, an overflow current $I_{OF}$ can be discharged into the semiconductor substrate 1 at the time of overflow and all of the electrons accumulated in the photodetecting portion 3 can be discharged into the semiconductor substrate 1 at the time of shutter. In addition, the substrate voltage $V_{sub}$ can greatly be decreased in the respective cases.

In the above examples, the maximum potential $V_A$, the height of the potential barrier $V_B$, the height of the potential barrier $V_C$, and the substrate voltage $V_{sub}$ at the time of depletion become 5.46 V, 2.37 V, 0.20 V, and 3.29 V. Thus, under this condition, the maximum potential $V_A$ becomes higher than the substrate voltage $V_{sub}$. In addition, the height of the potential barrier $V_C$ becomes as small as 0.20 V. As is apparent from the potential distribution at the time of depletion shown in FIG. 12, electrons are injected from the semiconductor substrate 1 into the photodetecting portion 3.

Because of this, in the conventional overflow drain structure shown in FIG. 10, for practical use, it is required to make the substrate voltage $V_{sub}$ higher than the above example. Otherwise, the effects that the substrate voltage $V_{sub}$ is greatly decreased to alleviate the burden of the drive circuit of the solid state imaging device cannot sufficiently be obtained. In addition, in the above example, there arise problems that the height of the potential barrier $V_B$ becomes extremely small and the signal charge is hardly accumulated in the photodetecting portion 3.

SUMMARY OF THE INVENTION

The solid state imaging device of the present invention includes:
- a semiconductor substrate of a first conductive type;
- a well layer made of a semiconductor of a second conductive type formed on the semiconductor substrate;
- a photodetecting portion made of a semiconductor of the first conductive type formed in an upper portion of the well layer;
- a high concentration semiconductor layer made of the second conductive type formed in an upper portion of the photodetecting portion;
- a first region of the first conductive type formed in an upper portion of the semiconductor substrate, being in contact with the well layer and positioned at least below the photodetecting portion, having higher concentration than the semiconductor substrate; and
- a second region of the second conductive type formed in a lower portion of the well layer, being in contact with the semiconductor substrate and positioned on the first region.

In one embodiment, the second region is formed in a lower portion of the well layer, being in contact with the semiconductor substrate and positioned at least on the first region so as to cover the first region.

In another embodiment, the second region is formed in an entire lower portion of the well layer, being in contact with the semiconductor substrate.

In another embodiment, the first region is formed in an entire upper portion of the semiconductor substrate, being in contact with the well layer.

In another embodiment of the present invention, a method for producing the above-mentioned solid state imaging device includes the step of forming the first region of the first conductive type which has higher concentration than the semiconductor substrate and the second region of the second conductive type which has higher concentration than the well layer by using a high energy ion implantation method.

The first region of the first conductive type which has higher concentration than the semiconductor substrate can prevent the extension of a depletion layer to the substrate, when the substrate voltage is reversely biased. Thus, the formation of the first region can decrease the substrate voltage (absolute value) during ordinary operation and shutter operation.

The second region of the second conductive type which has higher concentration than the well layer can prevent the decrease in the height of the potential barrier from the semiconductor substrate to the photodetecting portion, caused by the increased voltage (absolute value) of the photodetecting portion, when the substrate voltage is greatly decreased by the first region. Thus, the formation of the second region prevents charge from being injected from the semiconductor substrate into the photodetecting portion, even in the case where the photodetecting portion is depleted to increase a voltage.

As described above, according to the present invention, even in the case where the substrate voltage is greatly decreased by forming the first region so as to alleviate the burden on the drive circuit of the solid state imaging device, charge can be prevented from being injected from the semiconductor substrate into the photodetecting portion when the photodetecting portion is depleted.

According to a method for producing a solid state imaging device of the present invention, the high energy ion implantation method is used for the purpose of forming the first and second high concentration regions away from the surface of the semiconductor device. Thus, the productivity can greatly be improved compared with the case where the well layer is formed on the semiconductor substrate by an epitaxial method.

Thus, the invention described herein makes possible the advantages of (1) providing a solid state imaging device in which charge is not injected from a semiconductor substrate into a photodetecting portion at the time of depletion, even though a substrate voltage is greatly decreased; (2) providing a solid state imaging device having a great maximum allowable optical amount; and (3) providing a method for improving productivity of the solid state imaging device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples with reference to the drawings.

EXAMPLE 1

Figure 1:
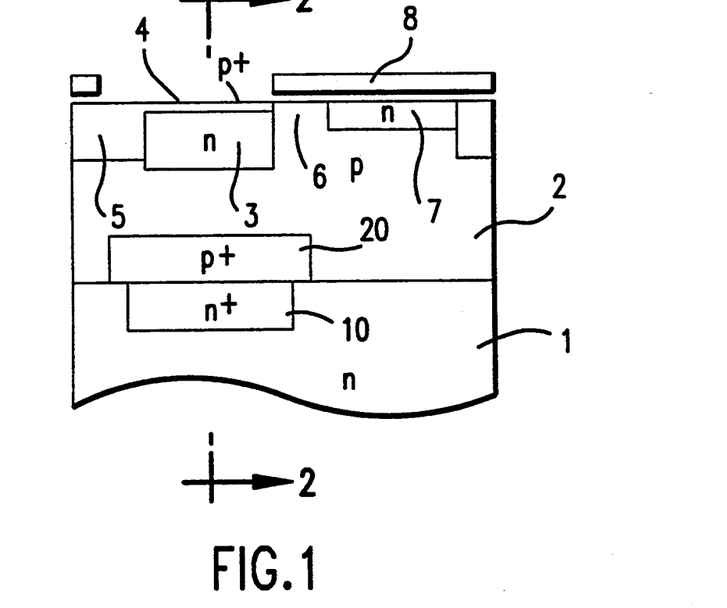
FIG. 1 is a partial longitudinal sectional view of a CCD imaging device of the first example according to the present invention.
Figure 2:
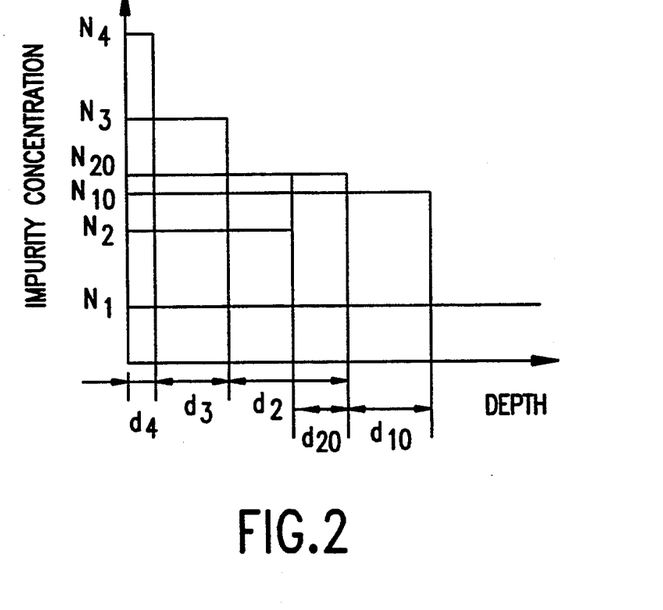
FIG. 2 shows a distribution of impurity concentration on an 2—2 section of the CCD imaging device shown in FIG. 1.
Figure 3:
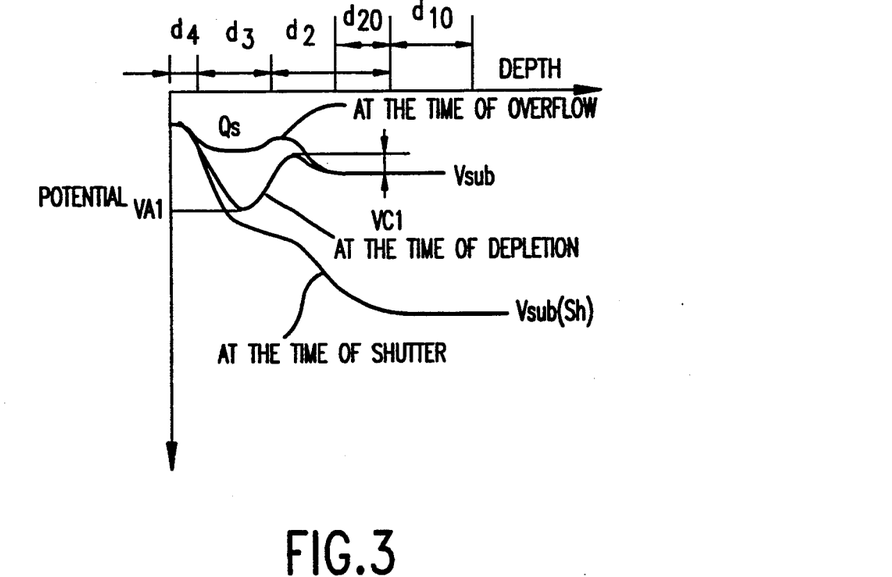
FIG. 3 is a diagram showing a potential distribution on an 2—2 section of the CCD imaging device shown in FIG. 1.

FIGS. 1 to 3 show the first example according to the present invention. FIG. 1 is a partial longitudinal sectional view of a CCD imaging device; FIG. 2 is a diagram showing a distribution of impurity concentration on an A—A section of FIG. 1; and FIG. 3 is a diagram showing a potential distribution on an A—A section of FIG. 1. In FIGS. 1 to 3, the same components as those of the conventional examples shown in FIGS. 7 to 12 are marked with the same reference numerals as those in FIGS. 7 to 12. The description thereof is omitted. For simplicity, the impurity concentration of FIG. 2 is approximately represented in a step form.

A vertical overflow drain structure of a CCD imaging device of an interline transfer type is shown according to the present example. This CCD imaging device is of a conductive type using electrons as signal charge. The present invention can be applied to a CCD imaging device of a frame transfer type or a linear transfer type having a vertical overflow drain structure as well as the CCD imaging device of an interline transfer type. In addition, when the conductive type is changed, the present invention can be applied to a CCD imaging device using holes as signal charge.

According to the present example, as in the conventional example of FIG. 7, the p-well layer 2 of an p-type semiconductor is formed on the n-type semiconductor substrate 1, the photodetecting portion 3 is formed in part of the p-well layer 2, and the upper surface of the photodetecting portion 3 are covered with the high concentration p-type semiconductor layer 4. In addition, as in the conventional example of FIG. 10, the first region 10 of a high concentration n-type semiconductor is formed below the photodetecting portion 3.

In the CCD imaging device of the present example, a second region 20 is formed on part of the semiconductor substrate 1. In the second region 20, impurity concentration is higher than that of the p-well layer 2. It is desired that the second region 20 is formed in a region below the photodetecting portion 3 and is made slightly larger than the first region 10 in a horizontal direction.

Since the first region 10 and the second region 20 are formed in the above-mentioned CCD imaging device, as shown in FIG. 2, the impurity concentration on a portion of the semiconductor substrate 1 in contact with the p-well layer 2 is $N_{10}$ which is higher than $N_1$ and that of the p-well layer 2 in contact with the semiconductor substrate 1 is $N_{20}$ which is higher than $N_2$. Thus, while the maximum potential $V_A$ is represented by Equation (1), the heights of the potential barriers $V_B$ and $V_C$ depend on the distance a from the boundary between the photodetecting portion 3 and the semiconductor layer 4 to the depth of the photodetecting portion 3 where the maximum potential thereof is obtained. More specifically, the maximum potential $V_A$ is represented by the following Equation (5):

$$V_A = \frac{qN_3}{2K_s\epsilon_o}\left(1 + \frac{N_3}{N_4}\right)b^2 \tag{5}$$

The heights of the potential barrier $V_B$ and $V_C$ are represented by the following Equation (6) or (7), depending upon the condition of the distance a.

If $a \leq \frac{N_2}{N_3} d_2$, then $\tag{6}$ $$V_B = \frac{qN_3}{2K_s\epsilon_o}\left(1 + \frac{N_3}{N_2}\right)a^2$$

$$V_C = \frac{qN_2}{2K_s\epsilon_o}\left(1 - \frac{N_2}{N_{10}}\right)\left(d_2 - \frac{N_3}{N_2}a\right)^2 +$$

$$\frac{qN_{20}}{2K_s\epsilon_o}\left(1 + \frac{N_{20}}{N_{10}}\right) \cdot$$

$$d_{20}\left\{d_{20} + 2\frac{N_2}{N_{20}}\left(d_2 - \frac{N_3}{N_2}a\right)\right\}$$

If $a > \frac{N_2}{N_3} d_2$, then $\tag{7}$ $$V_B = \frac{qN_3}{2K_s\epsilon_o}\left(1 + \frac{N_3}{N_2}\right)a^2 -$$

$$\frac{qN_2}{2K_s\epsilon_o}\left(1 - \frac{N_2}{N_{20}}\right)\left(\frac{N_3}{N_2}a - d_2\right)^2$$

$$V_C = \frac{qN_{20}}{2K_s\epsilon_o}\left(1 + \frac{N_{20}}{N_{10}}\right)\left\{d_{20} - \left(\frac{N_3}{N_2}a - d_2\right)\frac{N_2}{N_{20}}\right\}^2$$

Here, the height of the potential barrier $V_B$ becomes $V_{B0}(=0.5\text{ V})$ at the time of overflow. For simplicity, assuming that the distance a is represented by the following Equation (8):

$$a = a_0 = \frac{N_2}{N_3} d_2 \tag{8}$$

A distance $a_0$ at the time of overflow and a depth $d_2$ of the p-well layer 2 can be represented by the following Equation (9):

$$a_0 = \sqrt{\frac{2K_s\epsilon_0}{qN_3} \cdot \frac{V_{C0}}{(1 + N_3/N_2)}} \tag{9}$$

$$d_2 = \frac{N_3}{N_2} a_0$$

In addition, at this time, assuming that the height of the potential barrier $V_C$ is $V_{C0}$, a depth $d_{20}$ of the second region 20 is represented by the following Equation (10):

$$d_{20} = \sqrt{\frac{2K_s\epsilon_0}{qN_{20}} \cdot \frac{V_{C0}}{(1 + N_{20}/N_{10})}} \tag{10}$$

Assuming that the maximum potential $V_A$ is $V_{A0}$, the distance b is represented by the following Equation (11):

$$b = b_0 = \sqrt{\frac{2K_s\epsilon_0}{qN_3} \cdot \frac{V_{A0}}{(1 + N_3/N_4)}} \tag{11}$$

Charge $Q_S$ (amount of a saturated signal) at the time of overflow is represented by the following Equation (12):

$$Q_S = (d_3 - a_0 - b_0)N_3 \tag{12}$$

Assuming that the height of the potential barrier $V_C$ at the time of depletion is $V_{C1}(0.5\text{ V} < V_{C1} < V_{C0})$, it corresponds to the condition of a in Equation (7), so that the distance a is represented by the following Equation (13):

$$a = a_1 \tag{13}$$

$$= \left[\left\{d_{20} - \sqrt{\frac{2K_s\epsilon_0}{qN_{20}} \cdot \frac{V_{C1}}{(1 + N_{20}/N_{10})}}\right\}\frac{N_{20}}{N_2} + d_2\right]\frac{N_2}{N_3}$$

From Equations (7) and (13), $V_{B1}$ (height of the potential barrier $V_B$ at the time of depletion) can be obtained. Thus, the maximum potential $V_A$ is represented by the following Equation (14):

$$V_A = V_{A1} = V_{sub} - V_{C1} + V_{B1} \tag{14}$$

From Equations (5) and (14), the distance b can be obtained. Assuming that the distance thus obtained is $b_1$, a thickness $d_3$ of the photodetecting portion 3 is represented by the following Equation (15):

$$d_3 = a_1 + b_1 \tag{15}$$

In addition, the distance a becomes zero at the time of shutter, so that the distance b coincides with the thickness $d_3$ of the photodetecting portion 3. At this time, the substrate voltage $V_{sub}$ is represented by the following Equation (16):

$$V_{sub}(Sh) = \frac{qN_3}{2K_s\epsilon_0}\left(1 + \frac{N_3}{N_4}\right)d_3^2 + \quad (16)$$

$$\frac{qN_2}{2K_s\epsilon_0}\left(1 - \frac{N_2}{N_{10}}\right)d_2^2 +$$

$$\frac{qN_{20}}{2K_s\epsilon_0}\left(1 + \frac{N_{20}}{N_{10}}\right)d_{20}\left(d_{20} + \frac{2N_2}{N_{20}}d_2\right)$$

Assuming that the impurity concentrations are $N_1 = 2 \times 10^{14}$ cm$^{-3}$, $N_2 = 1 \times 10^{15}$ cm$^{-3}$, $N_3 = 2 \times 10^{16}$ cm$^{-3}$, and $N_4 = 1 \times 10^{18}$ cm$^{-3}$; the impurity concentrations of the first and second regions 10 and 20 are $N_{10} = 5 \times 10^{15}$ cm$^{-3}$ and $N_{20} = 1 \times 10^{16}$ cm$^{-3}$; and the respective potentials at the time of overflow are $V_A = 1.5$ V, $V_B = 0.5$ V, $V_C = 2.5$ V, and $V_{sub} = 3.5$ V, distances $a_0$ and $b_0$, a thickness $d_2$ of the p-well layer 2, and a thickness $d_{20}$ of the second region 20 become 0.039 μm, 0.308 μm, 0.785 μm, and 0.328 μm, respectively.

Assuming that the height of the potential barrier $V_{C1}$ at the time of depletion is 1.0 V, the respective potentials $V_{B1}$ and $V_{A1}$, the distances $a_1$ and $b_1$, and thickness $d_3$ of the photodetecting portion 3 are obtained as follows: $V_{B1} - 2.21$ V, $V_{A1} = 4.71$ V ($V_{sub} = 3.5$ V), $a_1 = 0.100$ μm, $b_1 = 0.546$ μm, and $d_3 = 0.646$ μm. Moreover, the charge $Q_S$ at the time of overflow and the substrate voltage $V_{sub}$ at the time of shutter are obtained as follows: $Q_S = 5.96 \times 10^{11}$ cm$^{-2}$ and $V_{sub}(Sh) = 10.66$ V.

As a result, the vertical overflow drain structure under the above-mentioned conditions can be formed, and the potential distribution in this case is as shown in FIG. 3. The substrate voltage $V_{sub}$ is 3.5 V during ordinary operations and 10.66 V during shutter operations. Thus, a greater decrease in the substrate voltage $V_{sub}$ is made possible, compared with the conventional examples shown in FIGS. 7 to 9. In the case where the photodetecting portion 3 is completely depleted, the maximum potential $V_{A1}$ becomes 4.71 V (which is lower than the substrate voltage $V_{sub}$, i.e., 3.5 V). However, the height of the potential barrier $V_{C1}$ from the semiconductor substrate 1 to the photodetecting portion 3 becomes 1.0 V (maintaining a sufficient potential barrier), so that electrons can be prevented from being injected from the semiconductor substrate 1 into the photodetecting portion 3. Moreover, the charge $Q_S$ at the time of overflow becomes the above-mentioned value (which is a sufficient amount).

In FIG. 2, the depth $d_{10}$ of the first region 10 is desirably made as follows:

When a reverse bias voltage is applied between the semiconductor substrate 1 and the p-well layer 2, a depletion portion extends from the junction interface between the semiconductor substrate 1 and the p-well layer 2 to the semiconductor substrate 1. At this time, the end of the depletion portion remains in the first region at least below the photodetecting portion 3. At the time of shutter, the depletion portion extends the most. Thus, the depth $d_{10}$ is determined by the following:

$$d_{10} \geq \left(\frac{N_2}{N_{20}}d_2 + d_{20}\right)\frac{N_{20}}{N_{10}} \quad (17)$$

EXAMPLE 2

Figure 4:
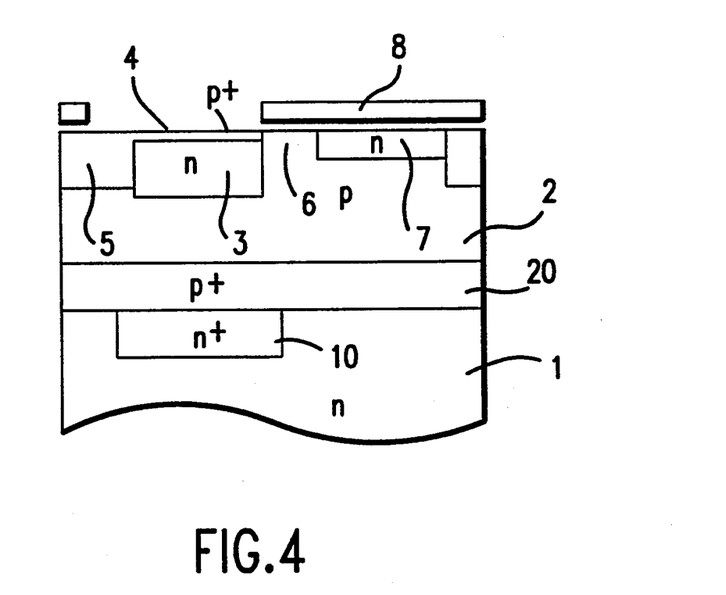
FIG. 4 is a partial longitudinal sectional view of a CCD imaging device of the second example according to the present invention.

FIG. 4 is a partial longitudinal sectional view of a CCD imaging device of the second example according to the present invention. The same components as those of the First example shown in FIG. 1 are marked with the same reference numerals as those in FIG. 1.

In the present example, the second region 20 is formed over entire surface of the semiconductor substrate 1.

In this structure, the potential distribution of the CCD imaging device is the same as that of FIG. 2, so that the same effects as those of Example 1 can be obtained. In addition, in the present example, the second region 20 is also formed below the transfer portion 7, so that charge can be prevented from being injected from the semiconductor substrate 1 to the transfer portion 7 without fail. Moreover, even in the case where the size of a pixel is further reduced, it is not required to consider the horizontal spreading of the second region 20.

EXAMPLE 3

Figure 5:
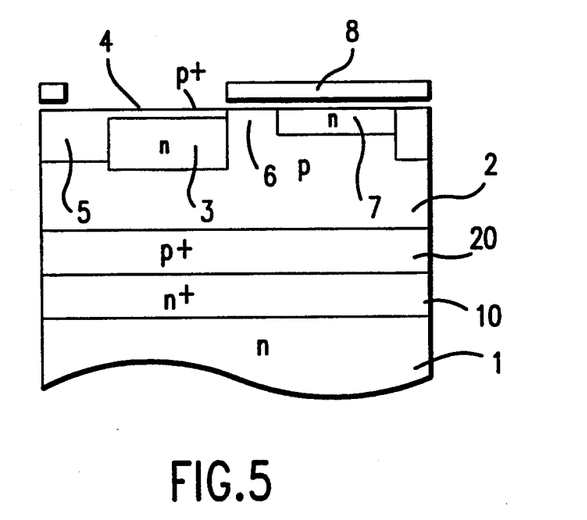
FIG. 5 is a partial longitudinal sectional view of a CCD imaging device of the third example according to the present invention.

FIG. 5 is a partial longitudinal sectional view of a CCD imaging device of the third example according to the present invention. The same components as those of Examples 1 and 2 shown in FIGS. 1 and 4 are marked with the same reference numerals as those in FIGS. 1 and 4. The description thereof is omitted.

In the present example, the first and second regions 10 and 20 are respectively formed in the semiconductor substrate 1 and the p-well layer 2. Both of the first and second regions 10 and 20 are formed over an entire pixel.

In the above-mentioned structure, the same potential distribution of the CCD imaging device as that of FIG. 2 is obtained, so that the same effects as those of Example 1 can be obtained. Charge can be prevented from being injected from the semiconductor substrate 1 to the transfer portion 7 in the same way as in Example 2, by selecting the conditions for forming the second region 20. In the present example, in the case where the size of a pixel is further reduced, it is not required to consider the horizontal spreading of the first region 10 as well as the second region 20. Thus, the first and second regions 10 and 20 are easily formed.

The first and second regions 10 and 20 in the above-mentioned respective examples are formed in positions away from the surface of the CCD imaging device. In these regions, impurity concentration is high. For forming these regions, a method in which the p-well layer 2 is formed on the semiconductor substrate 1 by using epitaxial growth can be used, as shown in Japanese Laid-Open Patent Publication No. 62-24666. In the above-mentioned respective examples, a high energy ion implantation method is used.

According to the high energy ion implantation method, an average implantation depth $R_P$, a standard deviation $\sigma_P$, and implantation energy E for implanting ions of boron and phosphorus have the following relationships (S. M. Sze ed. "VLSI Technology" 2nd. ed. (McGrow-Hill, 1988) Ch. 8):

Boron:

$$R_P = 85.6 E^{0.777} [\text{Å}]$$

$$\sigma_P = 1760 E^{0.160} - 1990 E^{0.0192} [\text{Å}]$$

Phosphorus $$R_P = 15.6E^{0.958} [\text{Å}]$$

$$\sigma_P = 22.4E^{0.659} [\text{Å}]$$

where E: keV

In the case where phosphorus is used for forming the first region 10 in the above-mentioned respective examples, assuming that the implantation energy E is 2.12 MeV, the average implantation depth $R_P$ and the standard deviation $\sigma_P$ are 2.40 μm and 0.35 μm, respectively. Thus, phosphorus is implanted in a region having a depth in the range of 2.05 μm to 2.75 μm with high concentration.

In the case where boron is used for forming the second region 20, assuming that the implantation energy E is 1.01 MeV, the average implantation depth $R_P$ and the standard deviation $\sigma_P$ are 1.85 μm and 0.14 μm, respectively. Thus, boron is implanted in a region having a depth in the range of 1.71 μm to 1.99 μm with high concentration.

Assuming that the thickness $d_4$ of the semiconductor layer 4 is 0.24 μm, the first region 10 is formed in a depth in the range of 2.00 μm to 2.81 μm; and the second region 20 is formed in a depth in the range of 1.67 μm to 2.00 μm. These results are almost equal to those of the ion implantation of phosphorus and boron. Thus, it is understood that the high energy ion implantation method is suitable for forming the first and second regions 10 and 20 in the above-mentioned respective examples.

The use of the high energy ion implantation method for the production of the CCD imaging device is conventionally known technique (e.g., "Nikkei Microdevice" published by Nikkei BP Corporation, pp. 99–103, December (1991)). However, conventionally, the high energy ion implantation method has been used for the purpose of improving the uniformity in a depth direction and preventing the dispersion in a horizontal direction. This method has never been used for forming the first region 10 and/or the second region 20 so as to improve the potential distribution as in the above-mentioned examples.

As is apparent from the above description, according to the present invention, electrons can be prevented from being injected from the semiconductor substrate to the photodetecting portion, in the case where the substrate voltage is decreased. Thus, a burden on the drive circuit of the solid state imaging device can sufficiently be alleviated by greatly decreasing the substrate voltage. In addition, the productivity of the solid state imaging device can be improved by using the high energy ion implantation method.

Furthermore, according to the present invention, a knee effect (i.e., an accumulated signal amount is increased with the increase in intensity of incident light after the accumulation of the electrons in the photodetecting portion reaches a saturated signal level) can substantially be prevented, compared with the conventional device for the following reasons.

In the conventional device, for the purpose of increasing the overflow current $I_{OF}$ with the increase in intensity of incident light, the height of the potential barrier $V_C$ from the semiconductor substrate 1 to the photodetecting portion 3 is greatly increased with the decrease in the height of the potential barrier $V_B$ from the photodetecting portion 3 to the semiconductor substrate 1. Namely, the maximum potential $V_A$ of the photodetecting portion 3 is remarkably decreased, so that the amount of signals accumulated in the photodetecting portion 3 is greatly increased.

On the other hand, according to the present invention, even though the height of the potential barrier $V_B$ is decreased, the height of the potential barrier $V_C$ is increased in a small amount. Namely, since the decrease in the potential $V_A$ is small, the increase in the amount of signals accumulated in the photodetecting portion 3 is suppressed to a lower level.

Figure 6:
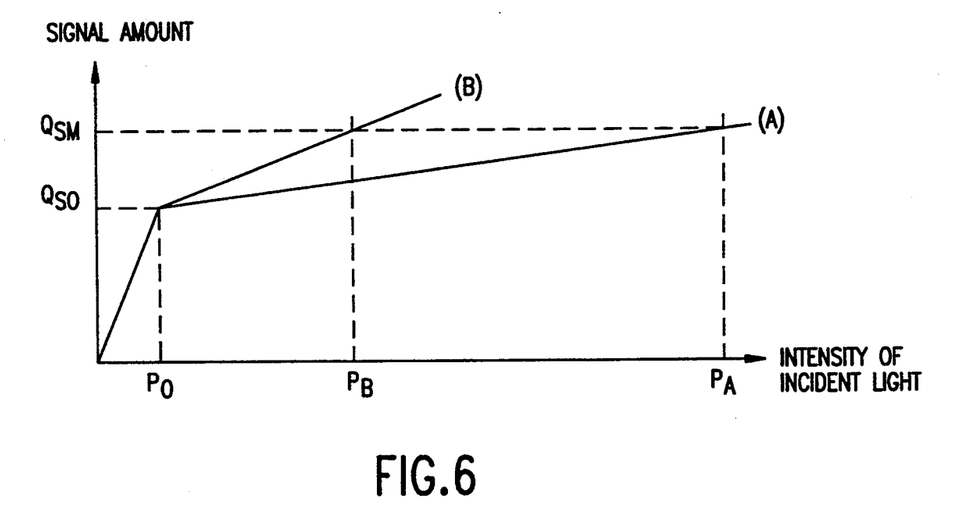
FIG. 6 is a graph showing the relationship between the intensity of incident light and the signal amount, illustrating the effects of the present invention.

FIG. 6 shows the relationship between the intensity of incident light and the amount of signals accumulated in the photodetecting portion 3. In this figure, (a) represents a characteristic curve of the device of the present invention; and (B) represents a characteristic curve of the conventional device. In the conventional device, as represented by (B), the amount of signals accumulated in the photodetecting portion 3 greatly increases after reaching a saturated signal level $Q_{SO}$ at intensity of incident light $P_0$, and reaches the maximum allowable signal amount $Q_{SM}$ at intensity of incident light $P_B$. On the other hand, in the device of the present invention, as represented by (A), the increase in the amount of signals accumulated in the photodetecting portion 3 is suppressed to a small level after reaching the saturated signal level $Q_{SO}$ at the intensity of incident light $P_0$, and reaches the maximum allowable signal amount $Q_{SM}$ at intensity of incident light $P_A$ ($P_A >> P_B$). Namely, according to the present invention, the maximum allowable optical amount of the device can greatly be increased from $P_B$ to $P_A$.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid state imaging device comprising:
   a semiconductor substrate of a first conductivity type;
   a well layer made of a semiconductor of a second conductivity type formed on the semiconductor substrate;
   a photodetecting portion made of a semiconductor of the first conductivity type formed in an upper portion of the well layer;
   a high concentration semiconductor layer made of the second conductivity type formed in an upper portion of the photodetecting portion;
   a first region of the first conductivity type formed in an upper portion of the semiconductor substrate, being in contact with the well layer and positioned at least below the photodetecting portion, and having a higher concentration than the semiconductor substrate; and
   a second region of the second conductivity type formed in a lower portion of the well layer, being in contact with the semiconductor substrate and positioned on the first region, and having a higher concentration than the well layer.

2. A solid state imaging device according to claim 1, wherein the second region is formed in a lower portion of the well layer, being in contact with the semiconductor substrate and positioned at least on the first region so as to cover the first region.

3. A solid state imaging device according to claim 1, wherein the second region is formed over an entire surface of the semiconductor substrate, and being in contact with the semiconductor substrate.

4. A solid state imaging device according to claim 3, wherein the first region is formed below an entire bottom surface of the second region, and being in contact with the well layer.

* * * * *